United States Patent [19]
Jeon et al.

[11] Patent Number: 5,878,105
[45] Date of Patent: Mar. 2, 1999

[54] X-RAY MASK

[75] Inventors: Young Jin Jeon; Jin Man Jung; Sang Soo Choi; Bo Woo Kim; Hyung Joun Yoo, all of Daejon-shi, Rep. of Korea

[73] Assignee: Electronics and Telecommunications Research Institute, Taejon, Rep. of Korea

[21] Appl. No.: 915,833

[22] Filed: Aug. 21, 1997

[30] Foreign Application Priority Data

Aug. 21, 1996 [KR] Rep. of Korea .................. 1996 34589

[51] Int. Cl.⁶ ........................................ G21K 5/00
[52] U.S. Cl. ............................... 378/35; 378/210
[58] Field of Search ........................ 378/35, 34

[56] References Cited

U.S. PATENT DOCUMENTS 5,199,055  3/1993  Noguchi et al. ....................... 378/35

OTHER PUBLICATIONS

Tsutomu Shoki, et al., *Effect of Anodic Bonding Temperature on Mechanical Distortion of SiC X–Ray Mask Substrate*, Jpn. J. Appl. Phys., Vol. 31, Dec. 1992, pp. 4215–4220.

*Primary Examiner*—Craig E. Church
*Attorney, Agent, or Firm*—Cohen, Pontani, Lieberman & Pavane

[57] ABSTRACT

An X-ray mask, which is used in transferring an image formed on a patterned mask to a wafer by exposing the mask with an X-ray, comprises a supplementary substrate attached to the back side of a support ring for preventing a thermal distortion of the X-ray mask due to the difference of thermal coefficient of expansion between a mask substrate and the support ring and for improving the resistance to the external mechanical stress, the supplementary substrate being made of the same material as the mask substrate and obtained through the same processing steps as the mask substrate.

4 Claims, 4 Drawing Sheets

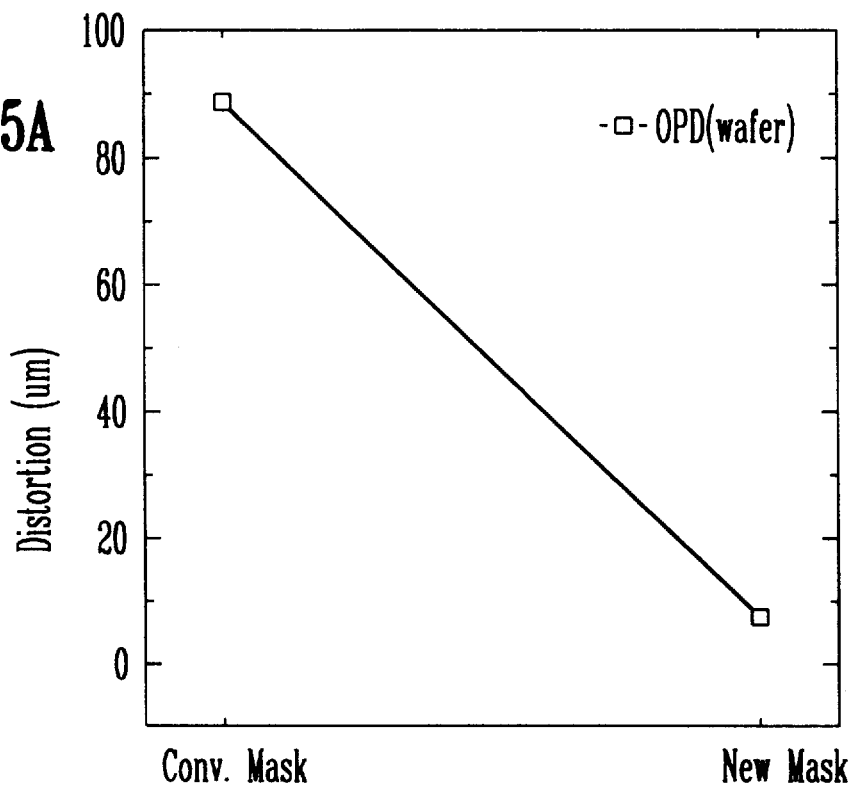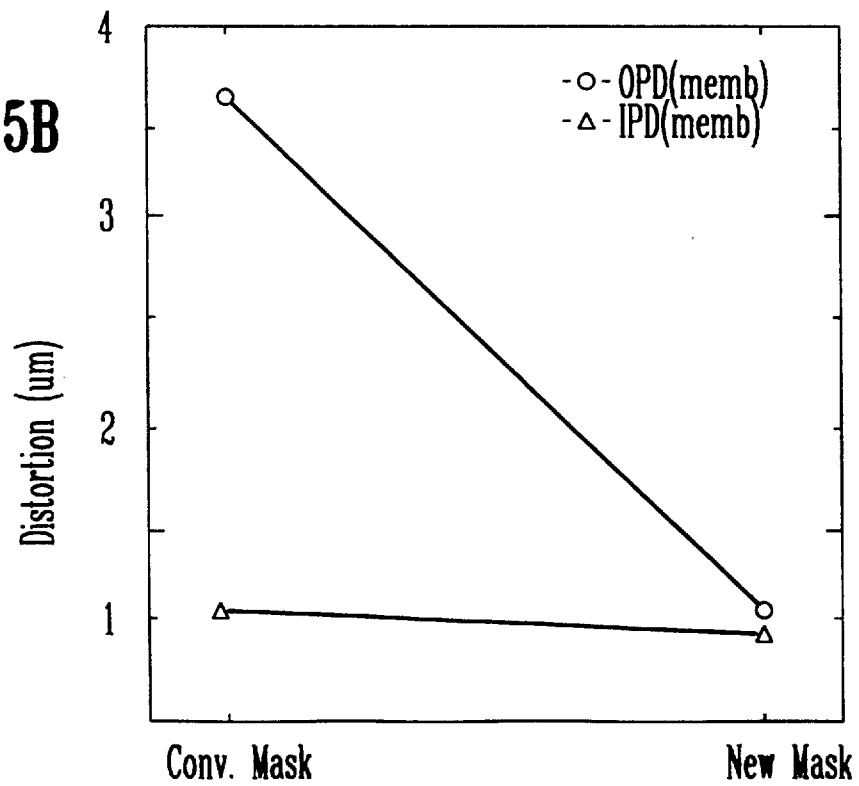

X-RAY MASK

BACKGROUND OF THE INVENTION

1. Field of the Invention

The present invention relates to an X-ray mask used in transferring an image to a wafer by exposing the mask with an X-ray through the mask having a pattern of the image. The present invention is also applied to masks for an electron-beam cell projection lithography and for an ion-beam lithography as well as to the x-ray mask.

2. Description of the Related Arts

FIG. 1 is a cross sectional view of a conventional X-ray mask. The X-ray mask comprises a main substrate 1A which is formed by forming X-ray transparent thin films 2A and 2B on the top and bottom surfaces of a mask substrate 1, a thin membrane 4 having a thickness of about 2 micron which can be obtained by eliminating the bottom of the mask substrate 1 in order to improve the optical transparentness, an absorber 3 for effectively interrupting the transmission of the X-ray by absorbing the X-ray, and a support ring 5 attached to the bottom of the main substrate 1A for mechanical stability and convenient handling. The membrane 4, which is a chip site region where designed device patterns are located, has a micropatterned absorber of 0.15 micron line width. Accordingly, it is required to make minimum the stress distortion and the thermal distortion of the membrane, and to improve the flatness of the membrane. In the measurement of the flatness and the distortion, parameters of OPD (Out-of-Plane Distortion) and IPD (In-Plane Distortion) are typically used. These parameters are greatly influenced by each processing step such as: the formation of the membrane through the deposition of the Xray transparent thin film and back-etching of the mask substrate; the attachment of the support ring; the micropatterning of the absorber onto the membrane; and a mounting of the final mask to an X-ray stepper.

FIG. 2 is a back plan view of the conventional X-ray mask. The X-ray mask can be obtained by depositing an Xray transparent thin film on the mask substrate-1 and by attaching the support ring 5 to the back side of the main substrate 1A. However, because the thermal coefficient of expansions TCES of the support ring 5 and of the main substrate are different, if the mask experiences any temperature variation after being attached to the support ring, the main substrate may be distorted in a convex manner as shown in FIG. 3A or in a concave manner as shown in FIG. 3B. The distortion of the main substrate significantly degrades a pattern position accuracy and an overlay accuracy. Therefore, it is very important to properly select the material and the structure of the mask substrate, the X-ray transparent thin film and the support ring.

As an instance, the thermal coefficient of expansion of a silicon wafer typically used as the mask substrate is $2.6 \times 10^{-6}/°C.$, and a pyrex used as the support ring has a TCE of $3.6 \times 10^{-6}/°C.$ greater than the mask substrate. Accordingly, when the support ring is attached to the back surface of the main substrate by using an anodic boding carried out in a temperature of approximately 300° C., and the assembly is cooled in room temperature, thermal from the difference of the TCEs is very great.

As exclaimed before, the distortion from the difference of the TCE is inevitable as long as the interfaces between physically different materials such as the mask substrate and the support ring exist. If the silicon wafer typically used as the mask substrate is used as the support ring, the thermal distortion can be enhanced but its mechanical strength is not enough to support the substrate.

SUMMARY OF THE INVENTION

It is an object of the present invention to provide an X-ray mask in which thermal distortion due to the difference of thermal coefficient of expansion of physically different materials can be prevented.

It is another object of the present invention to provide an X-ray mask which comprises a support ring having strong resistance to external mechanical stresses.

In order to accomplish the objects of the present invention, there is provided an X-ray mask in which a supplementary substrate for preventing distortions is attached to the back side of the support ring.

BRIEF DESCRIPTION OF THE DRAWINGS

With the above and additional objects and advantages in appear, the invention will be described with reference to the accompanying drawings, in which.

FIGS. 5A and 5B are graphs for comparing the magnitudes of CPD and IPD of X-ray mask of the present invention with those of the conventional X-ray mask.

DETAILED DESCRIPTION OF THE PREFERRED EMBODIMENTS

Figure 1:
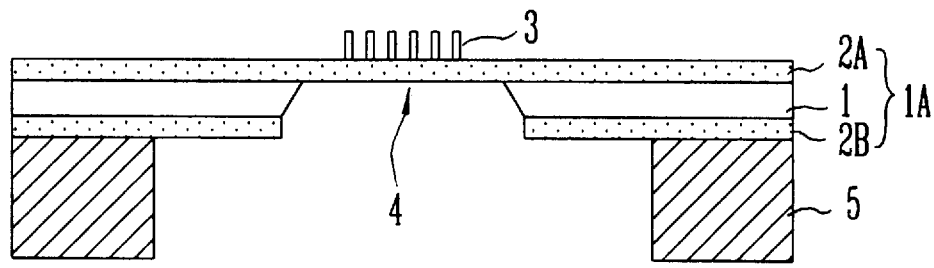
FIG. 1 is a cross sectional view of a conventional X-ray mask.
Figure 2:
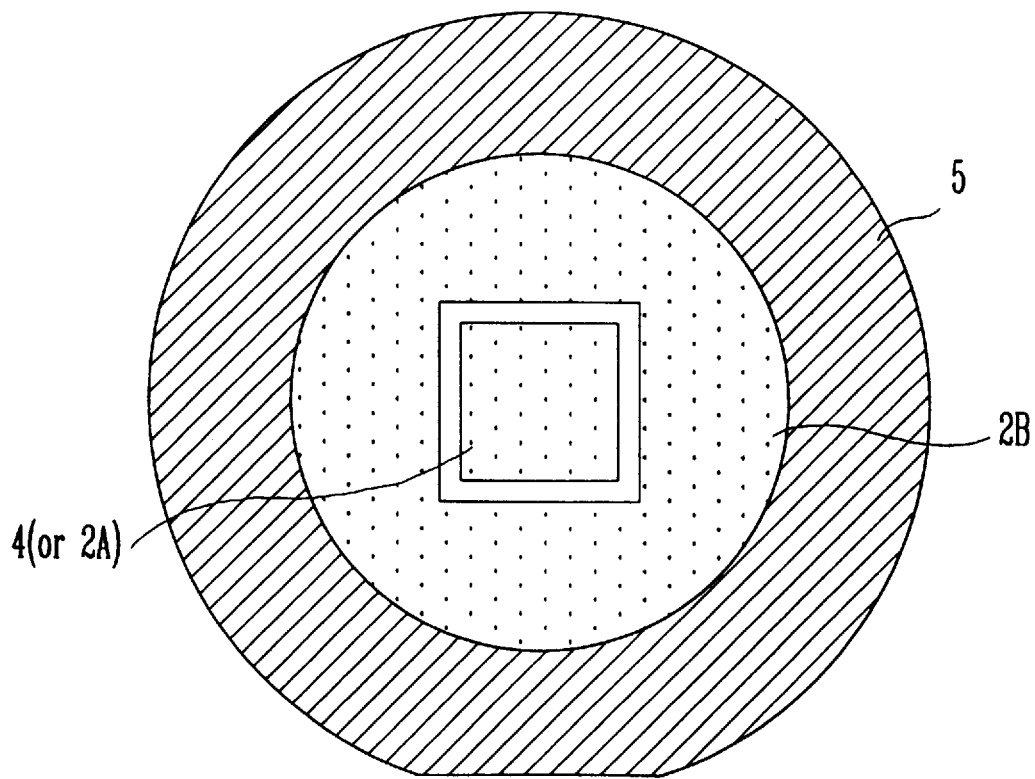
FIG. 2 is a back plan view of a support ring used in a conventional X-ray mask.
Figure 3A:
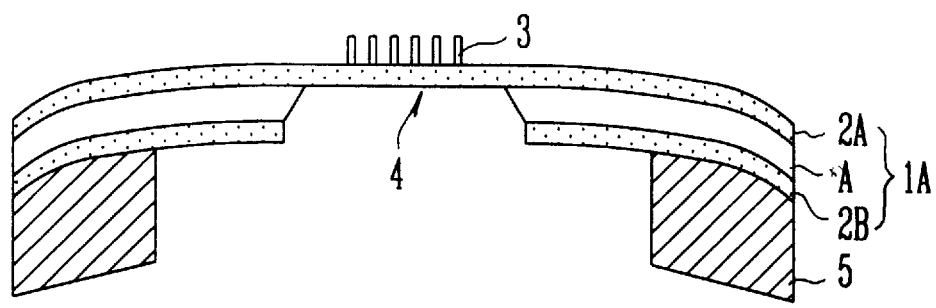
FIGS. 3A and 3B are cross sectional view of distorted mask due to the difference of thermal coefficient of expansion between a mask substrate and a support ring.
Figure 3B:
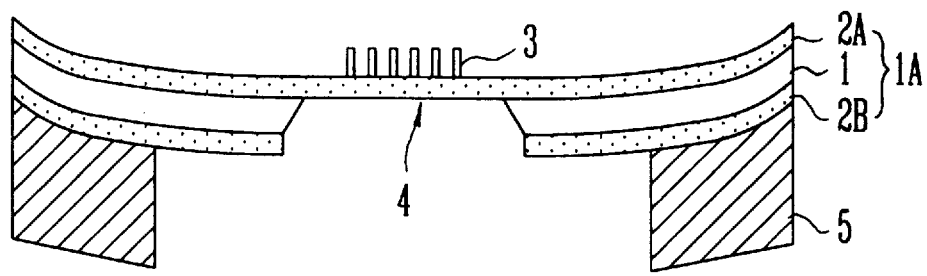
Figure 4A:
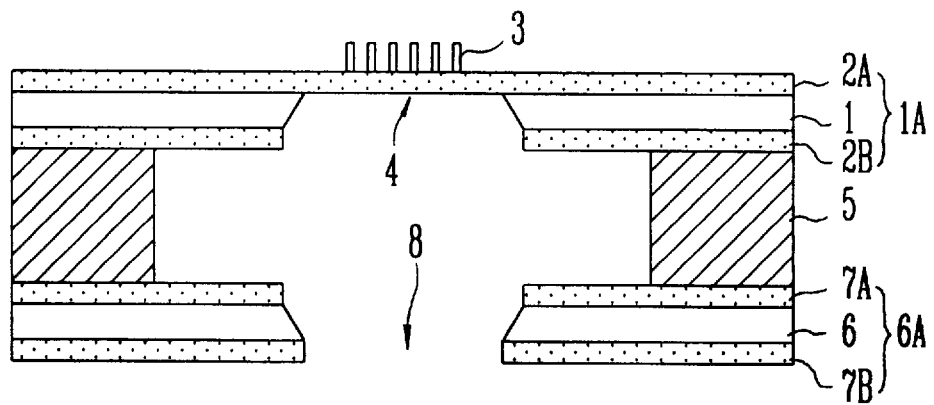
FIG. 4A is a cross sectional view of an X-ray mask according to the present invention.

FIG. 4A is a cross sectional view of an X-ray mask of the present invention. The X-ray mask comprises a main substrate 1A which is formed by forming X-ray transparent thin films 2A and 2B on the top and the bottom surfaces of a mask substrate 1, a thin membrane 4 having a thickness of about 2 micron which can be obtained by eliminating a part of the bottom of the mask substrate 1 in order to improve the optical transparentness, an absorber 3 for effectively interrupting the transmission of the X-ray by absorbing the X-ray, a support ring 5 attached to the bottom of the main substrate 1A for mechanical stability and convenient handling, and a supplementary substrate 6A attached, for preventing the distortion due to the interfaces of different materials, to the back side of the support ring 5 opposing to the top surface to which the main substrate 1A is attached. The supplementary substrate 6A can be obtained by forming X-ray transparent thin films 7A and 7B on the top and bottom surfaces of the support substrate 6. The support substrate 6 is preferably made of the same or similar material as the main substrate 1A, and the supplementary substrate 6A is subjected to the same or similar process steps as the mask substrate 1. Corresponding to the membrane 4 which is a chip site region of the main substrate 1A is formed an X-ray transparent window 8 in the supplementary substrate.

With this structure, thermal distortion occurred from the main substrate 1A is counterbalanced with the thermal distortion from the supplementary substrate 6A, resulting in the prevention of the thermal distortion of the main substrate. Accordingly, the distortion in the membrane 4 is significantly reduced, and the degradation of the pattern position accuracy and the overlay accuracy that is a main obstacle to the application of the X-ray mask can be fundamentally overcome.

In one embodiment of the present invention, the mask substrate 1 and the support substrate 6 are made of a silicon wafer having a thickness of 625 micron, an external diameter of 4 inch (100 mm), and a thermal coefficient of expansion of $2.6 \times 10^{-6}/°C$. The X-ray transparent thin films 2A and 2B/7A and 7B having a thickness of 2 micron are made of diamond (C), silicon (Si), silicon carbide (SiC), silicon nitride (SiN) or boron nitride (BN). In case of the silicon nitride thin film, the thermal coefficient of expansion is $2.7 \times 10^{-6}/°C$., and the residual stress in the film is 200 Mpa. The membrane 4 and the X-ray transparent window can be designed to have a regular square shape of 16 mm2. The support ring 5 is a glass ring having a thickness of 5 mm, an external diameter of 4 inch (100 mm) like the silicon wafer, an internal diameter of 80 mm, a width of 10 mm, and a thermal coefficient of expansion of $3.6 \times 10^{-6}/°C$.

Figure 4B:
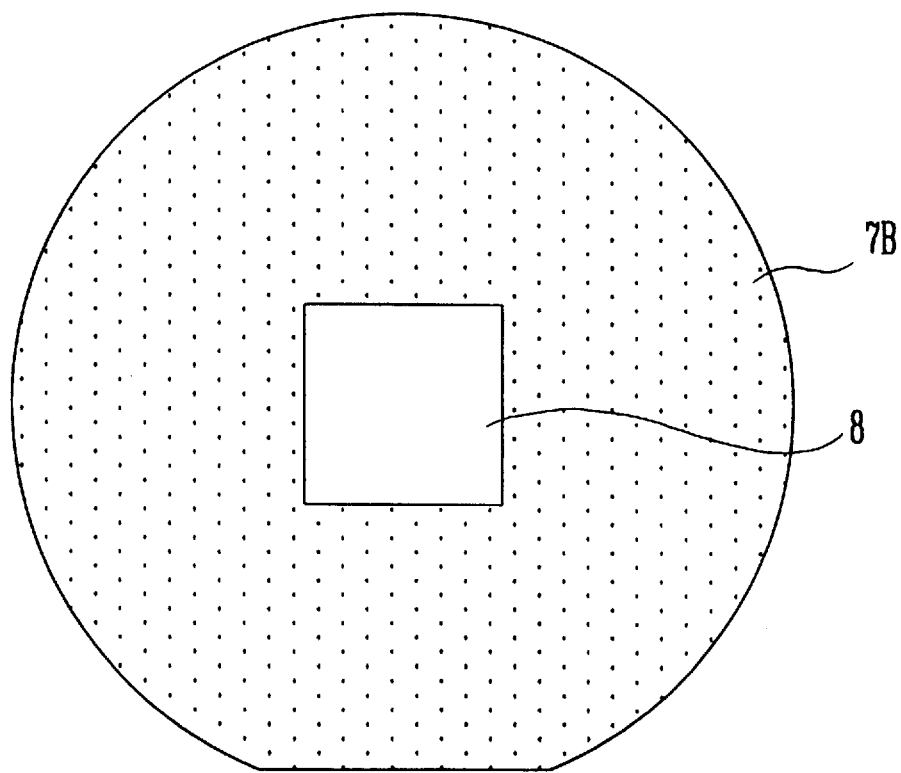
FIG. 4B is a back plan view of the supplementary substrate for preventing a distortion according to the present invention.

FIG. 4B is a back plan view of the supplementary substrate for preventing the distortion according to the present invention. The thin film 7 is made of the same material as the upper and the lower thin films 2A and 2B. The X-ray transparent window 8 is designed to have the same or similar shape as the membrane 4, and to have the same or slightly larger size as the membrane 4. For the transmission of the X-ray, corresponding portions of the X-ray transparent window, the distortion prevention support substrate 6, and the upper and the lower X-ray transparent thin films 7A and 7B must be cut and removed.

FIGS. 5A and 5B are graphs for showing the characteristics of the X-ray mask according to the present invention, which can be used in expecting the magnitudes of OPD and IPD. The values of OPD and IPD are obtained by anodic bonding the silicon wafer and the glass ring with slowly heating them to 300° C. and then slowly cooling in room temperature(25° C.). The variation of OPD on the entire surface of the mask substrate is shown in FIG. 5A, while the variations of OPD and IPD in the membrane region are shown in FIG. 5B.

Referring to FIG. 5A, it can be understood that the value of OPD is significantly reduced to 6.0 micron in the present invention from 88.1 micron which is observed in the entire surface of the conventional 4-inch X-ray mask (Conv. Mask). In the membrane region, the value of OPD is reduced from 3.5 micron to 0.9 micron, and the value of IPD is lowered from 1.0 micron to 0.7 micron as shown in FIG. 5B. As a result, the present invention can effectively prevent the distortion of the X-ray mask.

As explained so far, with the present invention, the thermal distortion of the mask due to the difference of the thermal coefficient of expansion can be prevented, and the resistance to the external mechanical stress to the mask can be improved. Accordingly, the problem of the degradation of the pattern position accuracy and of the overlay accuracy due to the distortion of the membrane can be fundamentally solved, which allows the mask for the next generation Integrated Circuit to be realized. The present invention ran be applied to masks for electron-beam cell projection lithography and for ion-beam lithography as well as to the X-ray mask.

Numerous alterations and modifications of the structure herein disclosed will present themselves to those skilled in the art. However, it is to be understood that the above described embodiments are for purposes of illustration only and not to be construed as a limitation of the present invention. All such modifications which do not depart from the spirit of the present invention are intended to be included within the scope of the appended claims.

What is claimed is:

1. An x-ray mask comprising:
   a mask substrate having a top and a bottom surface on which an upper x-ray transparent thin film and a lower x-ray transparent thin film are formed, respectively;
   a membrane being formed by a hole through a part of the mask substrate and a part the lower x-ray transparent thin film so that a back side of the upper x-ray transparent thin film is exposed;
   an absorber on a front side of the upper x-ray transparent thin film for absorbing an x-ray transmitted through the x-ray mask;
   a support ring having one side attached to an unexposed region of the lower x-ray transparent thin film such that the ring surrounds the hole through the lower x-ray transparent thin film; and
   a supplementary substrate attached to a second side of the support ring opposing the mask substrate for preventing a distortion of the x-ray mask.

2. The x-ray mask as claimed in claim 1, wherein said supplementary substrate comprises the same material as the mask substrate.

3. The x-ray mask as claimed in claims 1, wherein said supplementary substrate comprises an x-ray transparent window corresponding to the membrane so that an x-ray passes through the x-ray transparent window.

4. The x-ray mask as claimed in claim 1, wherein supplementary substrate further comprises upper and lower x-ray transparent thin films; and said upper and lower x-ray transparent thin films of said supplementary substrate and said upper x-ray transparent thin film and said lower x-ray transparent thin film of said mask substrate, each comprise a material selected from a group consisting of a diamond, a silicon, a silicon carbide, a silicon nitride, and a boron nitride.

\* \* \* \* \*